United States Patent
Kim et al.

[11] Patent Number: 5,932,923
[45] Date of Patent: Aug. 3, 1999

[54] SEMICONDUCTOR DEVICE PACKAGES HAVING DUMMY BLOCK LEADS AND TIE BARS WITH EXTENDED PORTIONS TO PREVENT FORMATION OF AIR TRAPS IN THE ENCAPSULATE

[75] Inventors: Tae Hyeong Kim; Hee Sun Rho; In Sik Cho; Gi Su Yoo; Sang Hyeop Lee, all of Cheonan, Rep. of Korea

[73] Assignee: Samsung Electronics Co., Ltd., Suwon, Rep. of Korea

[21] Appl. No.: 08/943,129

[22] Filed: Oct. 3, 1997

[30]     Foreign Application Priority Data

Oct. 4, 1996 [KR] Rep. of Korea ...................... 96-44028

[51] Int. Cl.⁶ ................................................ H01L 23/495
[52] U.S. Cl. ............................................ 257/667; 257/670
[58] Field of Search ...................... 257/666, 667, 257/670, 787

[56]                References Cited

U.S. PATENT DOCUMENTS 5,293,065  3/1994  Chan ...................................... 257/667

FOREIGN PATENT DOCUMENTS 63-265454  11/1988  Japan ...................... 257/667
4-239164   8/1992   Japan ...................... 257/667

*Primary Examiner*—Olik Chaudhuri
*Assistant Examiner*—Nathan K. Kelley
*Attorney, Agent, or Firm*—Jones, Volentine, Steinberg & Whitt, L.L.P.

[57]                ABSTRACT

A semiconductor device package is equipped with devices for preventing the formulation of air traps in its encapsulated package body. These devices include dummy block leads formed on the outermost inner lead of each row of inner leads, and extended portions formed on each tie bar. Each dummy block lead extends from the end of an outermost inner lead and is integrally formed therewith. The tie bar extended portions are separated into several parts defined by spaces between the parts, and the several parts are formed integral with each other and with the tie bar. The dummy block leads and the tie bar extended portions may be formed so as to be inclined relative to horizontal and with jagged edges at their side surfaces. The dummy block leads and tie bar extended portions serve to reduce the velocity of the potting resin which forms the encapsulate, as it enters the die cavity for encapsulation, but before the resin actually contacts the chip or the inner leads. Thereby, the flow velocity at various points within the mold cavity is uniform, and formation of air traps is prevented.

16 Claims, 8 Drawing Sheets

SEMICONDUCTOR DEVICE PACKAGES HAVING DUMMY BLOCK LEADS AND TIE BARS WITH EXTENDED PORTIONS TO PREVENT FORMATION OF AIR TRAPS IN THE ENCAPSULATE

BACKGROUND OF THE INVENTION

1. Field of the Invention

The present invention relates generally to semiconductor device packages. More particularly, it relates to semiconductor device packages having dummy block leads and/or tie bars having extending portions. Both the dummy block leads and the tie bar extending portions function to prevent the formation of air traps or voids in the encapsulate.

2. Background of the Related Art

Semiconductor device packages having a die pad onto which one or more chips is attached make up about 70–80% of the total semiconductor device package production. Such packages are advantageous in that they can be manufactured by simple methods using existing production equipment.

However, some problems may occur in their mass production. In particular, when their assemblies are encapsulated in a transfer mold with an encapsulate such as a potting resin, for example epoxy molding compound, turbulence is produced at or near the lead frame or electrical interconnection parts, resulting in the formation of air traps or voids in the resulting encapsulated package body. The air traps or voids at or near the lead frame or electrical interconnections cause package failures such as electrical shorts.

FIG. 1 is a partially cut away perspective view of a conventional semiconductor device package; FIG. 2 is a cross-sectional view taken along the line '2—2' in FIG. 1; and FIG. 3 is a cross-sectional view taken along the line '3—3' in FIG. 1.

With reference to FIGS. 1 through 3, the semiconductor device package 100 includes a chip 10, a die pad 30 and inner leads 50. The chip 10 is attached to an upper surface of the die pad 30 by way of an adhesive 20 such as Ag-epoxy adhesive. The chip 10 is electrically connected to the inner leads 50 by way of bonding wires 70. The die pad 30 is mechanically linked to side rails (not shown) via tie bars 40.

The package 100 also has an encapsulate covering the chip 10, die pad 30, tie bars 40, inner leads 50, and electrical interconnections including bonding wires 70 to form a package body 80. The encapsulate may be potting resins such as epoxy molding compounds.

Outer leads 60, which are formed integrally with inner leads 50, extend from the package body 80, and are formed, for example, in a J-shape suitable for mounting onto external devices.

FIG. 4 depicts the flow of the potting resin within the mold during the encapsulation of the package assembly. In cavities 312, 412 defined by the upper mold die 310 and the lower mold die 410, the package assembly is encapsulated with the potting resin introduced through a gate 414 of the lower mold die 410.

The arrows in the drawings indicate the flow of the potting resin within the cavity. As the potting resin collides with the chip 10 and the die pad 30, its velocity drops, while the potting resin near the inner wall of the mold dies 310, 410 retains its original velocity. This results in a deviation of the flow velocity of the potting resin within the cavities 312, 412. The deviation generates turbulence in the potting resin flow, and consequently, the formation of air traps or voids in the resulting package body 80. This is even more significant when the package assembly contains a larger chip.

When the package is subjected to reliability tests which are performed under an elevated temperature and an elevated pressure, water vapor is supplied into the package body. If the package has air traps or voids therein, the water vapor localizes at the air traps or voids and then expands. This may adversely affect the mechanical strength of the package body 80 and deteriorate the package reliability.

Moreover, for packages having a multi-pin lead frame, the potting resin collides with the inner leads (50 in FIG. 1) and generates turbulence as well. This causes the formation of air traps near or at inner leads 50, resulting in electrical shorts of bonding wires 70 electrically connecting the inner leads with the chip.

SUMMARY OF THE INVENTION

The present invention provides semiconductor device packages of high reliability, which are free of air traps in the molded package body.

The semiconductor device package according to the present invention comprises a plurality of inner leads arranged in rows, at least one outermost inner lead thereof having a dummy block lead extending from an end thereof and integrally formed with the outermost inner lead. According to the present invention, each dummy block lead is preferably positioned at an angle relative to a horizontal surface, for example the top surface of the die pad, and each dummy block lead is preferably formed with a jagged edge along its side surfaces.

The semiconductor device package according to present invention further comprises tie bars which have portions extending therefrom, the extended portions being separated into several parts so as to form spaces therebetween, and the extended portions are preferably positioned at an angle relative to a horizontal surface, for example the top surface of the die pad. According to the present invention, the extended portions of the tie bars preferably have jagged edges at their side surfaces.

BRIEF DESCRIPTION OF THE ATTACHED DRAWINGS

These and various other features and advantages of the present invention will be described with reference to the accompanying drawings, in which.

DETAILED DESCRIPTION OF PREFERRED EMBODIMENT

Figure 1:
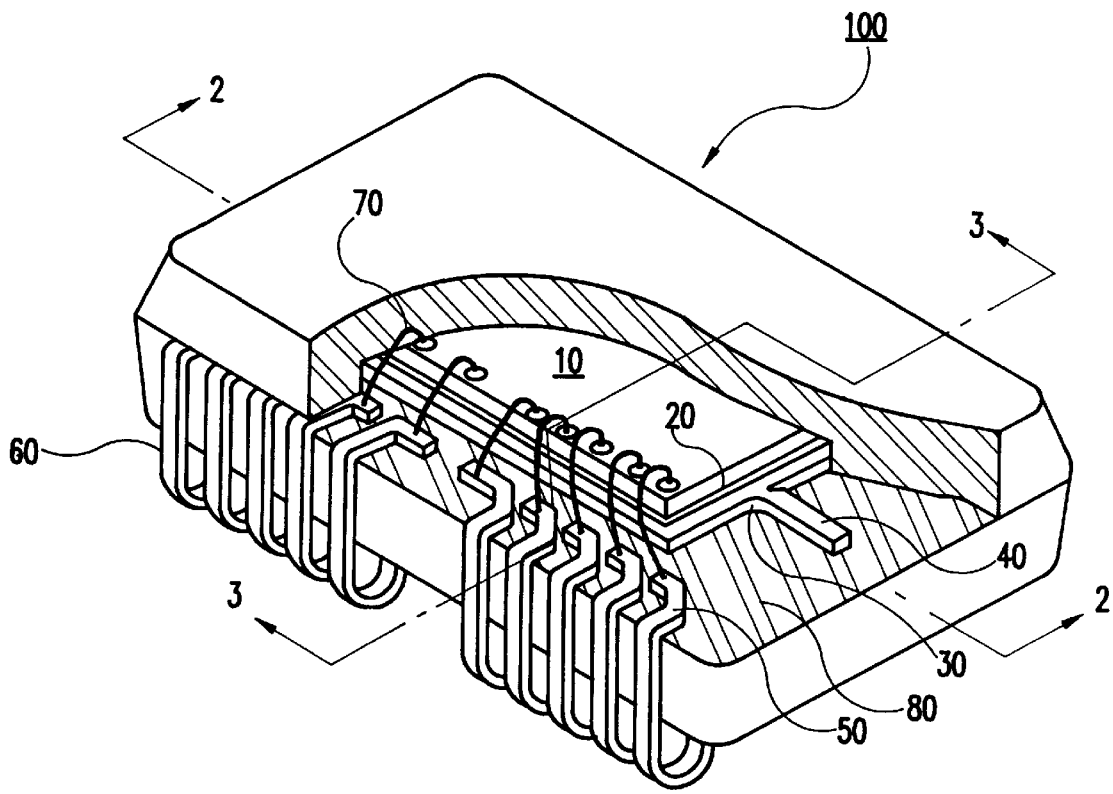
FIG. 1 is a partially cut away perspective view of a conventional semiconductor device package.
Figure 2:
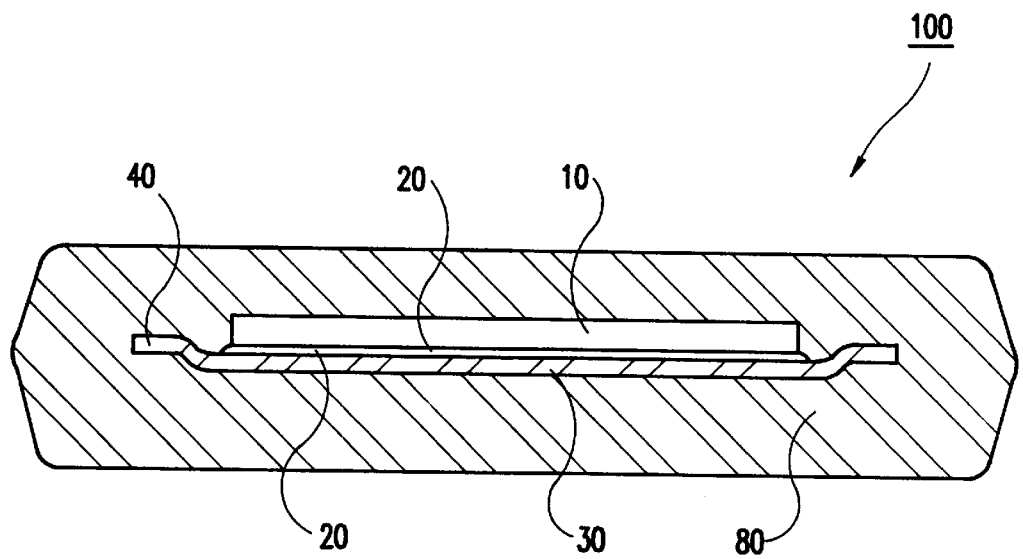
FIG. 2 is a cross-sectional view taken along the line '2—2' in FIG. 1.
Figure 3:
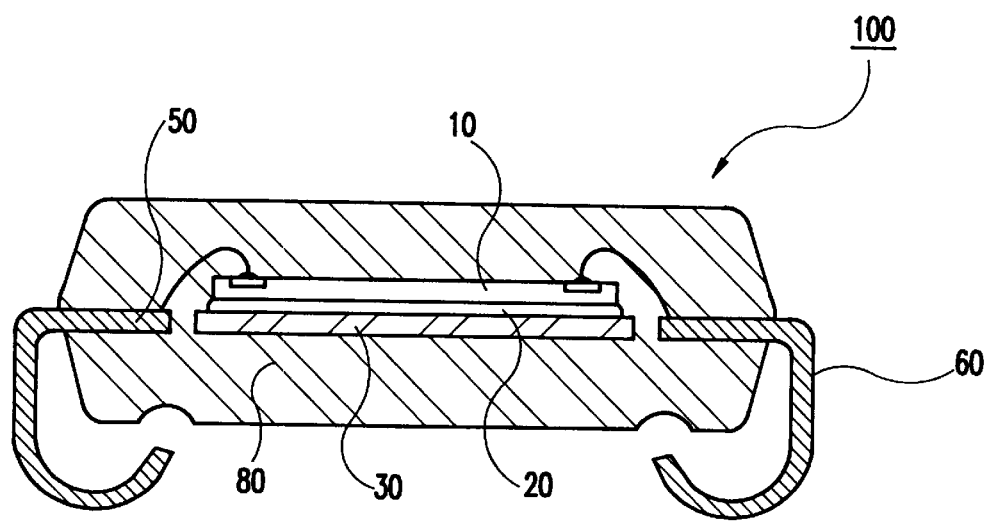
FIG. 3 is a cross-sectional view taken along the line '3—3' in FIG. 1.

The present invention will now be described in detail with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions is exaggerated for clarity. Like numbers refer to like elements throughout.

Figure 5:
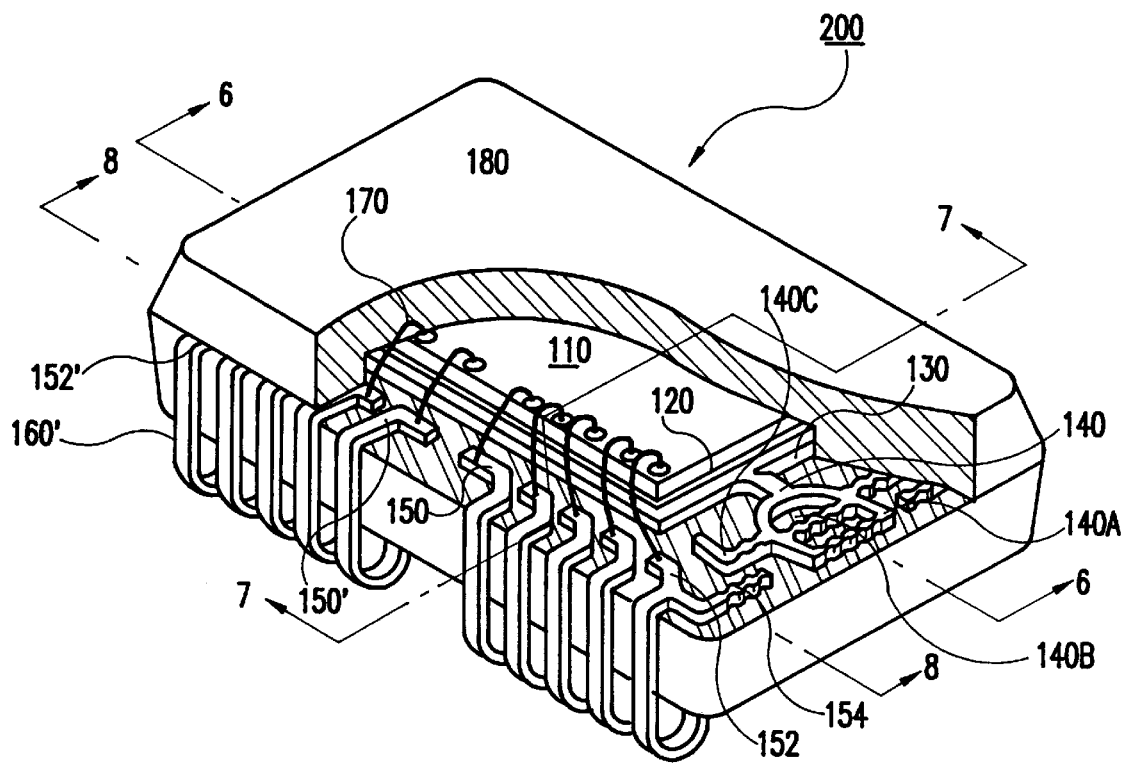
FIG. 5 is a partially cut away perspective view of a semiconductor device package according to the present invention.
Figure 6:
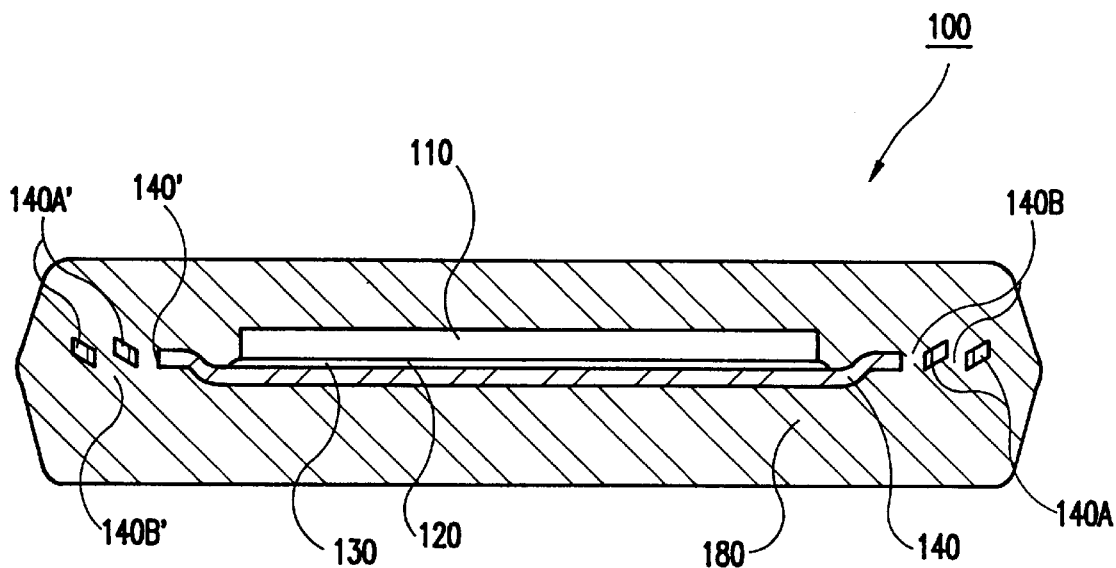
FIG. 6 is a cross-sectional view taken along the line '6—6' in FIG. 5.
Figure 7:
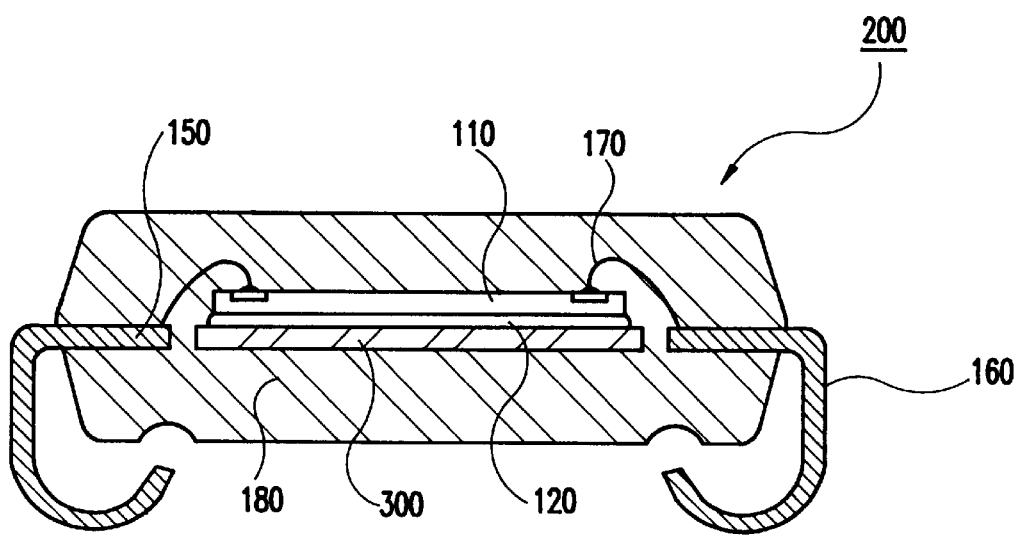
FIG. 7 is a cross-sectional view taken along the line '7—7' in FIG. 5.
Figure 8:
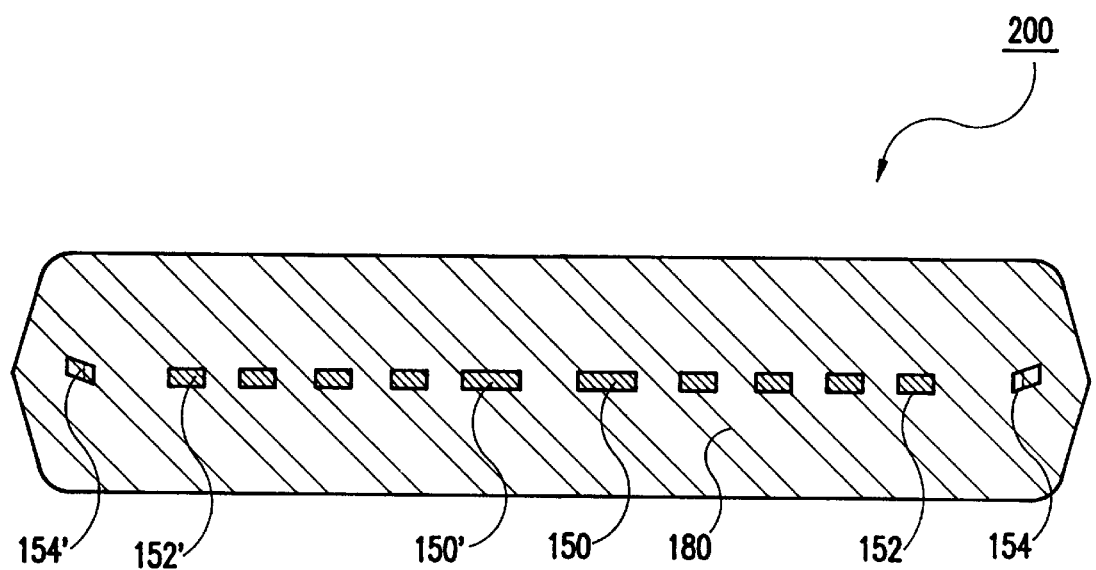
FIG. 8 is a cross-sectional view taken along the line '8—8' in FIG. 5.

FIG. 5 is a partially cut away perspective view of a semiconductor device according to the present invention; FIG. 6 is a cross-sectional view taken along the line '6—6' in FIG. 5; FIG. 7 is a cross-sectional view taken along the line '7—7' in FIG. 5; and FIG. 8 is a cross-sectional view taken along the line '8—8' in FIG. 5.

With reference to FIGS. 5 through 8, the semiconductor device package 200 comprises a chip 110 and a die pad 130 attached to a lower surface of the chip 110. The semiconductor device package 200 comprises a plurality of inner leads 150 and 150' formed in rows to the right and left, respectively as shown in FIG. 5, of a center point on the side of the chip 110, spaced from the die pad 130. The opposite side of the chip 110 may also have similar rows of inner leads 150 and 150'. The outermost inner lead of each row of inner leads is designated 152 or 152' as shown in FIG. 5. The inner leads 150, 150', 152 and 152' are formed separate from the die pad 130.

Figure 9:
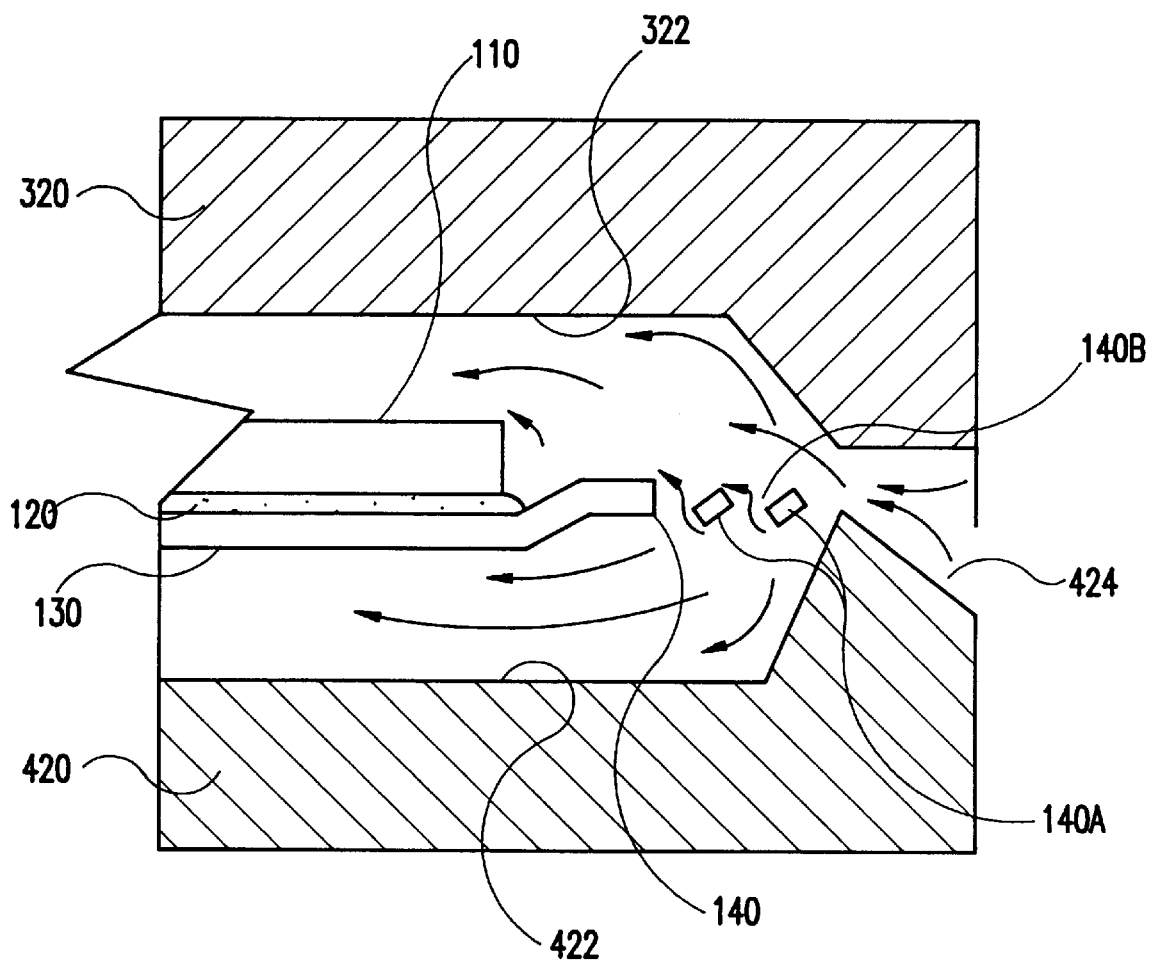
FIG. 9 depicts the flow of a potting resin within a mold during the molding process for encapsulating the semiconductor device package of FIG. 5, as viewed along the side of the package as shown in FIG. 6.
Figure 10:
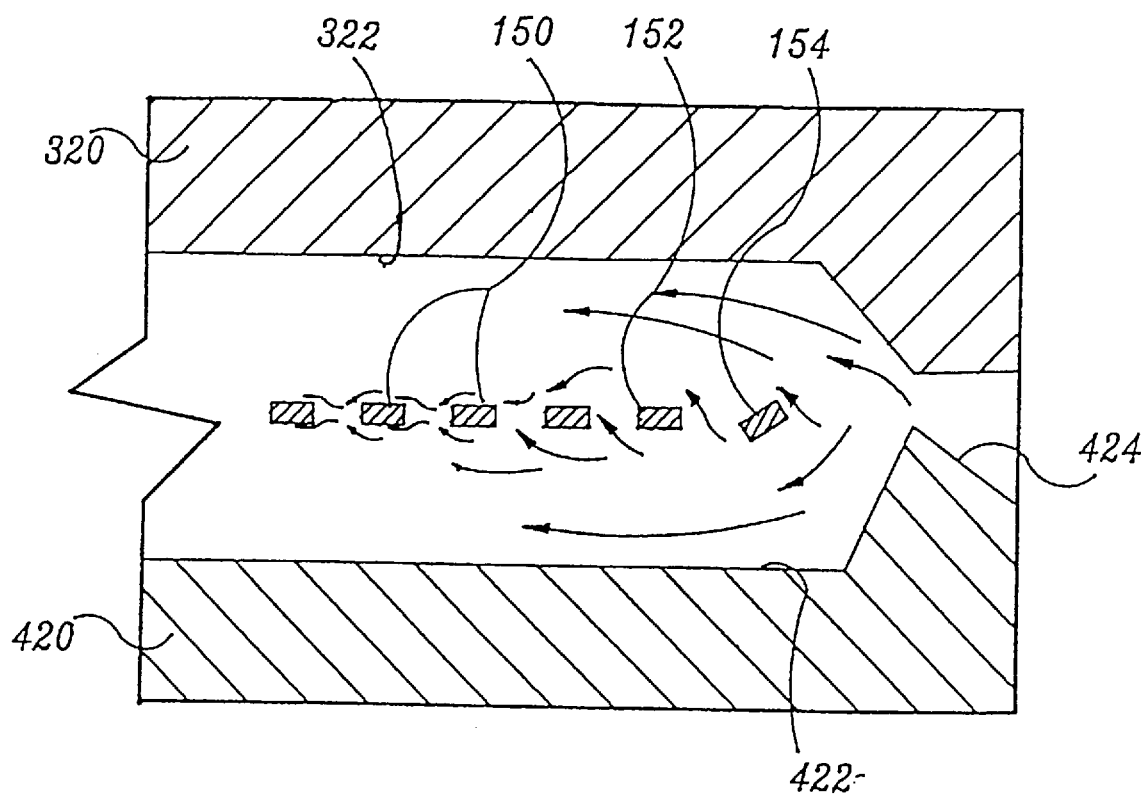
FIG. 10 depicts the flow of potting resin as shown in FIG. 9, as viewed along the side of the package as shown in FIG. 8.

When the chip 110, die pad 130 and inner leads 150, 150', 152 and 152' are assembled and ready to be encapsulated, the assembly is placed into a mold 320, 420 as shown in FIGS. 9 and 10. When in position in the mold, the outermost inner lead 152 is located closest to the introduction gate 424 of the mold die 420 (see FIGS. 8 and 10). The outermost inner lead 152' is located farthest from the introduction gate 424, on the opposite end of the die pad 130 from outermost inner lead 152.

The outermost inner leads 152, 152' of each row may have dummy block leads 154, 154' at one end thereof, the dummy block leads 154, 154' extending outward from the end of the row of inner leads and extending toward each other from opposite sides of the package 200 as shown in FIG. 5. The package 200 also has electrical connectors 170, for example bonding wires, for electrically connecting the chip 110 to the inner leads 150, 150', 152, and 152'. The package 200 further comprises: tie bars 140 integrally formed with the die pad 130; an encapsulate 180 covering the chip 110, the inner leads 150, 150', 152, 152', the dummy block leads 154, 154', the electrical connectors 170 and the tie bars 140 to form a package body; and outer leads 160, 160' integrally formed with the inner leads 150, 150', 152, 152', the outer leads 160, 160' extending outward from the encapsulate 180.

For the package 200, the chip 110 is attached to an upper surface of the die pad 130 by way of an adhesive 120, for example Ag-epoxy adhesive. The die pad 130 is linked to side rails (not shown) of a lead frame via tie bars 140.

The plurality of inner leads 150, 152 may form two rows at opposite sides of the die pad 130, as shown in FIGS. 5 and 7, or they may be formed in fours rows, one row on each side of the die pad 130.

In the embodiment shown in FIGS. 5–8, there are four outermost inner leads 152, 152, 152', 152', each located at a respective corner of the package body 180. The two outermost inner leads 152 near the introduction gate 424 (see FIGS. 8 and 10) into which the potting resin is introduced have dummy block leads 154 extending therefrom. The other two outermost inner leads 152' which are located opposite to the introduction gate 424 (see FIGS. 8 and 10) may also have dummy block leads 154' extending therefrom.

The dummy block leads 154, 154' extend toward the tie bar 140. The dummy block leads 154, 154' may have jagged edges on their side surfaces, and may be formed so as to be inclined at an angle of about 30 to 40 degrees with respect to a horizontal surface, as defined for example, by the top surface of die pad 130. The dummy block leads 154, 154' may be formed by a stamping method. Although FIG. 8 shows the dummy block leads 154, 154' angled upward so that their top surface rises as they extend outward toward the edge of the package, the dummy block leads 154, 154' may be angled downward so that their top surface descends as they extend outward toward the edge of the package. The dummy block leads 154 may be angled in the same direction as dummy block leads 154', or the dummy block leads 154 may be angled in the opposite direction of dummy block leads 154'.

According to the present invention, the package may have two opposing tie bars 140, 140' formed for example at the ends of die pad 130. The tie bar 140 is formed at a position which is closest to the introduction gate 424 (see FIGS. 6 and FIG. 9) when it is encapsulated within the mold.

The tie bar 140 has an extended portion 140A which extends outward from the die pad 130 (or toward an inner wall of the package body), and the extended portion 140A is separated into several parts so as to form spaces 140B as shown in FIG. 5. The separated parts defined by spaces 140B are formed integral with each other and with the tie bar 140. The extended portion 140A is formed so as to be inclined at an angle of 30 to 40 degrees relative to a horizontal surface, for example, as defined by the top surface of die pad 130. The extended portion 140A is formed with jagged edges at its side surfaces, and may be formed by a stamping method. In addition, tie bar 140 may be provided with projections 140C extending therefrom, which may also have jagged edges at its side surfaces.

The other tie bar 140' located on the opposite end of chip 110 from the tie bar 140 also may be provided with extended portions 140A' extending outward from the die pad 130 as shown in FIG. 6. The extended portion 140A' is separated into several parts so as to form spaces 140B'. The separated parts defined by the spaces 140B' are formed integral with each other and with the tie bar 140'. Similar to extended portion 140A, the extended portion 140A' is formed so as to be inclined at an angle of 30 to 40 degrees relative to a horizontal surface, for example, as defined by the top surface of die pad 130. Extended portion 140A' may have jagged edges at its side surfaces, and may be formed by a stamping method. The extended portion 140A' has projections 140C', which may also be formed with jagged edges at its side surfaces.

The extended portion 140A or 140A' may be inclined so that the separated parts defined by spaces 140B or 140B' thereof have the same direction of incline. By contrast, the extended portion 140A may have an inclined direction that is opposite to that of the extended portion 140A' located on the opposite end of chip 110.

The package 200 also has an encapsulate such as an epoxy potting resin which covers the chip 110, die pad 130, tie bars 140, 140', 140A, 140A', 140B, 140B', 140C, 140C', inner leads 150, 150', 152, 152' and electrical interconnections including bonding wires 170 to form a package body 180. Outer leads 160, 160', which are formed integrally with inner leads 150, 150' and extend outward from the package body 180, are formed with a J-shape suitable for mounting onto external devices.

FIGS. 9 and 10 depict the flow of the potting resin within the mold during the encapsulation of the semiconductor device package according to the present invention shown in FIG. 5. The detailed structure of the mold dies 320, 420 will be omitted since it has the same structure as the mold dies described in relation to FIG. 4.

FIG. 9 depicts the flow of the potting resin from the sectional plane in FIG. 6, while FIG. 10 depicts the flow of the potting resin from the sectional plane in FIG. 8. As can be seen from FIGS. 9 and 10, the formation of turbulence can be effectively prevented by allowing the resin to pass through the spaces 140B.

Figure 4:
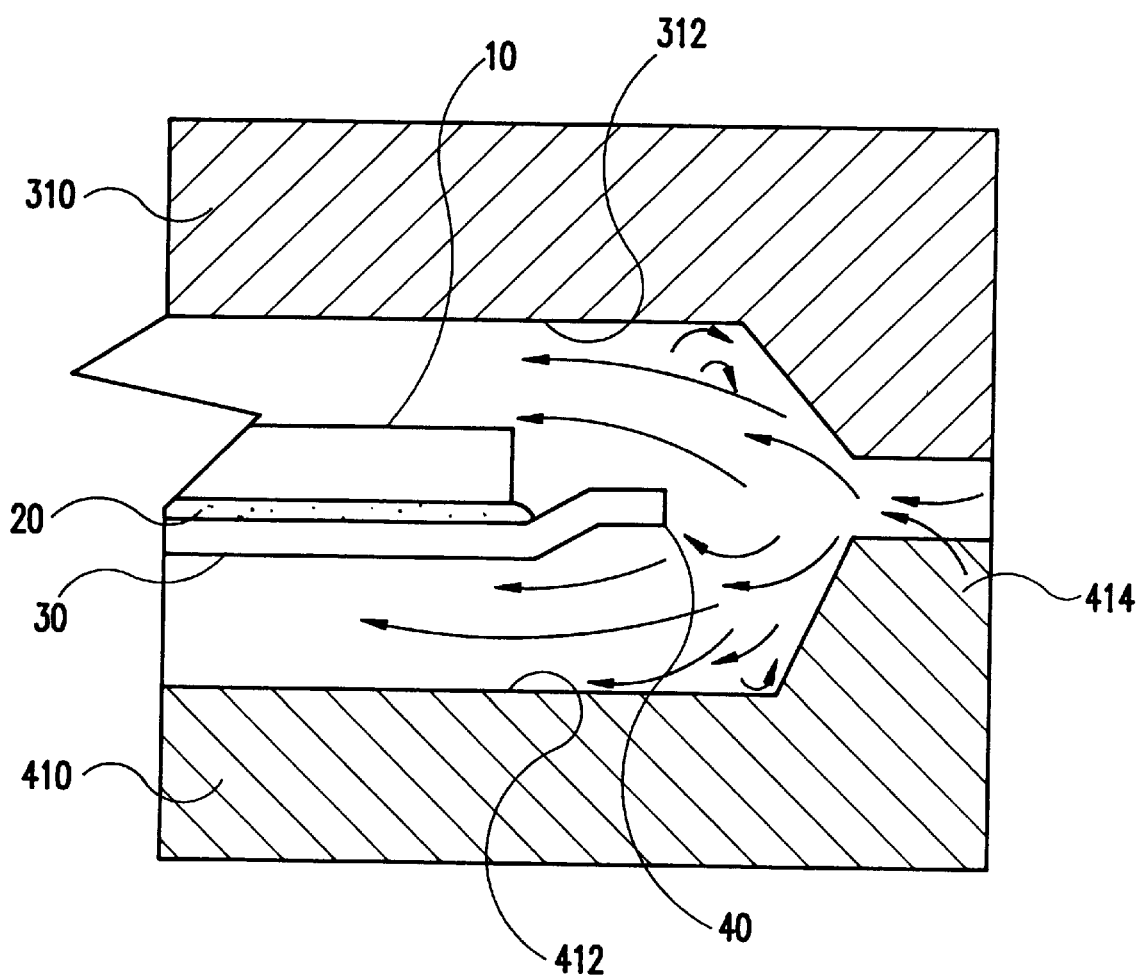
FIG. 4 depicts a flow of a potting resin within a mold during a molding process for encapsulating the semiconductor device package of FIG. 1.

Referring to FIG. 9, the extended portion 140A of tie bar 140 guides the potting resin to flow in a certain inclined direction and through the spaces 140B as the potting resin collides with the extended portion 140A, instead of flowing unimpeded in a horizontal direction as shown in FIG. 4. Therefore, before the potting resin collides with the die pad 130 and the chip 110, it has already collided with the extended portion 140A and its velocity has already been partially reduced. This prevents the sudden drop in velocity experienced by the potting resin upon the collision with the die pad and chip as shown in FIG. 4, thereby avoiding the formation of turbulence and preventing the formation of air traps within the package body.

Similarly, referring to FIG. 10, the dummy block leads 154 also reduce the velocity of the potting resin flowing towards inner leads 150 and bonding wires 170, so that the flow velocities of the potting resin at various points within the mold cavity are uniform, whether the resin is flowing into a portion of the mold cavity which contains package elements, or whether the resin is flowing into a portion of the mold cavity without package elements. In other words, there are no deviations, or very small deviations, in the flow velocities of the potting resin flowing within the mold cavity. Therefore, the air traps or voids at or near lead frames 150, 150', 152, 152' can be effectively prevented.

The jagged surfaces on the sides of the of the extended portions 140A, 140A', 140C, 140C' and dummy block leads 154, 154' also function to reduce the flow velocity of the potting resin as it impacts the respective structures.

The present invention may be applied to lead-on-chip (LOC) packages in which inner leads are directly bonded to the chip as well as electrically connected to bonding pads on the chip. Further, the configuration of the outer leads can be changed to any configuration in which the outer leads can be electrically connected to external electronic devices.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor device package, comprising:
a semiconductor chip mounted on a die pad;
a plurality of inner leads arranged in rows along opposing sides of said semiconductor chip, each of said plurality of inner leads being electrically connected to said chip and separate from said die pad, each row having an outermost inner lead;
a first dummy block lead attached to one of said outermost inner leads, said first dummy block lead extending from said one of said outermost inner leads, said first dummy block lead being formed so as to be inclined at an angle with respect to a top surface of said die pad;
an encapsulate covering said chip, said inner leads, said first dummy block lead, and said electrical connections to form a package body, said package body having two ends, a first end of said two ends being located near a gate of a transfer mold into which said encapsulate is introduced to form said package body, and a second end being located opposite from said first end, said outermost inner leads being located at either said first or said second end of the package body, and said one of said outermost inner leads to which said first dummy block lead is attached is located at said first end; and
a plurality of outer leads attached to corresponding ones of said inner leads and extending outward of said package body.

2. The semiconductor device package according to claim 1, further comprising a second dummy block lead attached to one of said outermost inner leads located at said second end.

3. The semiconductor device package according to claim 1, further comprising a second dummy block lead attached to one of said outermost inner leads on said first end on an opposing side of said semiconductor chip from said first dummy block lead. wherein said first dummy block lead and said second dummy block lead extend toward each other from opposite sides of said package body.

4. The semiconductor device package according to claim 2, further comprising a third dummy block lead attached to another one of said outermost inner leads on said first end, said first and third dummy block leads extending toward each other from opposite sides of said package body, and a fourth dummy block lead attached to another one of said outermost inner leads on said second end, said second and fourth dummy block leads extending toward each other from opposite sides of said package body.

5. The semiconductor device package according to claim 1, wherein said first dummy block lead has side surfaces with jagged edges.

6. The semiconductor device package according to claim 2, wherein said first and second dummy block leads have side surfaces with jagged edges, and said first and second dummy block leads are formed so as to be inclined at an angle with respect to the top surface of said die pad.

7. The semiconductor device package according to claim 6, wherein said first dummy block lead has a first direction of incline, while said second dummy block lead have a second direction of incline, said first direction of incline being opposite to said second direction of incline.

8. A semiconductor device package; comprising:
a semiconductor chip mounted on a die pad;
a plurality of inner leads arranged in rows along opposing sides of said semiconductor chip that are electrically connected to said chip and are separate from said die pad;
tie bars integrally formed with said die pad;
an encapsulate covering said chip, said inner leads, said electrical connections and said tie bars to form a package body, said package body having two ends, a first end of said two ends being located near a gate of a transfer mold into which said encapsulate is introduced to form said package body, and a second end being located opposite from said first end; and a plurality of outer leads attached to corresponding ones of said inner leads and extending outward of said package body, wherein at least one tie bar of said tie bars is located at said first end of said package body, said at least one tie bar having an extended portion which extends outward from said at least one tie bar toward said first end of said package body, said extended portion being separated into several parts defined by spaces between said parts, said several parts being integral with each other and with said at least one tie bar.

9. The semiconductor device package according to claim 8, wherein said extended portion has side surfaces with jagged edges.

10. The semiconductor device package according to claim 1, wherein said tie bars have projections extending therefrom.

11. The semiconductor device package according to claim 10, wherein said projections have side surfaces with jagged edges.

12. The semiconductor device package accordinig to claim 8, wherein said several parts of the extended portion of the at least one tie bar are formed so as to be inclined at an angle with respect to a top surface of said die pad.

13. The semiconductor device package according to claim 12, wherein at least one other tie bar of said tie bars is located at said second end, said at least one other tie bar having an extended portion which extends outward from said at least one other tie bar toward said second end of said package body. said extended portion being separated into several parts defined by spaces between said parts, said several parts being integral with each other and with said at least one other tie bar.

14. The semiconductor device package according to claim 13, wherein said several parts of the extended portion of said at least one tie bar are formed so as to be inclined at a first direction of incline with respect to a top surface of said die pad, and said several parts of the extended portion of said at least one other tie bar are formed so as to be inclined at a second direction of incline with respect to the top surface of said die pad, said first direction of incline being opposite to said second direction of incline.

15. The semiconductor device package according to claim 8, further comprising dummy block leads, each dummy block lead being attached to and extending from a respective one of said outermost inner leads at said first end.

16. The semiconductor device package according to claim 1, further comprising tie bars integrally formed with said die pad.

* * * * *